(12) United States Patent
Nakamura

(10) Patent No.: US 12,166,479 B2
(45) Date of Patent: Dec. 10, 2024

(54) LEVEL SHIFT CIRCUITRY

(71) Applicants: Kabushiki Kaisha Toshiba, Tokyo (JP); Toshiba Electronic Devices & Storage Corporation, Tokyo (JP)

(72) Inventor: Tetsuya Nakamura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 122 days.

(21) Appl. No.: 18/165,859

(22) Filed: Feb. 7, 2023

(65) Prior Publication Data

US 2024/0097684 A1 Mar. 21, 2024

(30) Foreign Application Priority Data

Sep. 16, 2022 (JP) ................................. 2022-148419

(51) Int. Cl.
 *H03K 19/0185* (2006.01)
(52) U.S. Cl.
 CPC ............................ *H03K 19/018521* (2013.01)
(58) Field of Classification Search
 CPC .......................................... H03K 19/018521
 USPC ......................................................... 327/333
 See application file for complete search history.

(56) References Cited

U.S. PATENT DOCUMENTS

| | | | | |
|---|---|---|---|---|
| 9,438,239 B2* | 9/2016 | Gao | ....................... | H02M 3/158 |
| 2016/0254793 A1* | 9/2016 | Su | ............................ | H03K 5/12 |
| | | | | 330/257 |
| 2019/0245526 A1* | 8/2019 | Satou | ............. | H03K 19/018507 |

FOREIGN PATENT DOCUMENTS

| | | |
|---|---|---|
| JP | 2017-501607 A | 1/2017 |
| JP | 6149677 B2 | 6/2017 |
| JP | 2019-140476 A | 8/2019 |

* cited by examiner

*Primary Examiner* — Tomi Skibinski
(74) *Attorney, Agent, or Firm* — Kim & Stewart LLP

(57) ABSTRACT

A level shift circuitry includes a first impedance, a second impedance, a first transistor, a second transistor, a current source, and a first capacitor. The first impedance and the second impedance have a first end connected to a positive-side power supply voltage. The first transistor has a control terminal and a first end connected to a second end of the first impedance. The second transistor has a control terminal, a first end connected to a second end of the second impedance, and a second end connected to a second end of the first transistor. The current source has a first end connected to the second end of the first transistor and a second end connected to a negative-side power supply voltage. The first capacitor has a first end connected to the second end of the second impedance and a second end.

13 Claims, 14 Drawing Sheets

LEVEL SHIFT CIRCUITRY

CROSS-REFERENCE TO RELATED APPLICATIONS

This application is based upon and claims the benefit of priority from Japanese Patent Application No. 2022-148419, filed on Sep. 16, 2022, the entire contents of which are incorporated herein by reference.

FIELD

Embodiments of the present invention relate to a level shift circuitry.

BACKGROUND

A level shift circuitry is a circuitry that boosts a signal voltage that can be acquired from a power supply voltage in a device requiring a reference voltage higher than the power supply voltage, and is applied to various semiconductor integrated circuitries provided with an input/output interface, a bus, and the like. The level shift circuitry typically includes a p-type metal-oxide-semiconductor field-effect transistor (MOSFET) and an n-type MOSFET.

In the level shift circuitry, when a power supply voltage is supplied and a level of an output signal voltage boosted and output with respect to an input signal voltage increases, a voltage equal to or higher than an allowable withstand voltage value may be applied between terminals of the MOSFETs during the operation. When a high voltage higher than withstand voltage performance is applied, the MOSFET is broken down. In order to avoid the breakdown of the MOSFET, various transistors including a high-withstand-voltage MOSFET can also be used. However, there is a problem that the cost thereof increases.

DETAILED DESCRIPTION

Figure 1:
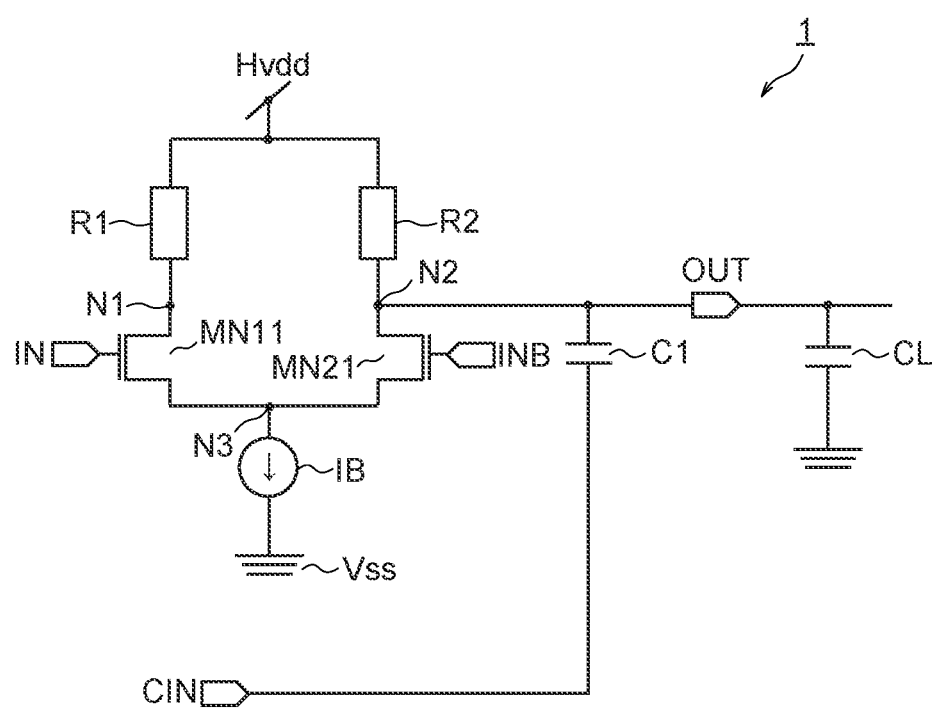
FIGS. 1 and 2 are circuitry diagrams illustrating examples of level shift circuitries according to embodiments.

According to one embodiment, a level shift circuitry includes a first impedance, a second impedance, a first transistor, a second transistor, a current source, and a first capacitor. The first impedance has a first end connected to a positive-side power supply voltage. The second impedance has a first end connected to the positive-side power supply voltage and outputs an output signal from a second end. The first transistor has a control terminal to which an input signal is input and a first end connected to a second end of the first impedance. The second transistor has a control terminal to which a differential signal of the input signal is input, a first end connected to the second end of the second impedance, and a second end connected to a second end of the first transistor. The current source has a first end connected to the second end of the first transistor and a second end connected to a negative-side power supply voltage. The first capacitor has a first end connected to the second end of the second impedance and a second end to which a signal having a same phase as the input signal is input.

Hereinafter, embodiments of the present invention will be described with reference to the drawings. The drawings and the description of the embodiments are illustrated as examples, and do not limit the present invention. In the present disclosure, terms "less than" and "equal to or more than", and terms indicating comparison similar thereto may be used, but these terms may be appropriately replaced with terms "equal to or less than", "more than", and the like within a range causing no mutual contradiction. The reverse is similar, and terms "equal to or less than" and "more than" may be replaced with terms "less than" and "equal to or more than", respectively. In principle, unless otherwise noted, in each constituent element, a terminal on a side connected to a positive-side power supply (upper side in the drawing) is defined as a first end, and a terminal connected to a negative-side power supply (lower side in the drawing) is defined as a second end.

First Embodiment

In the present embodiment, a potential of an output signal is determined by a bias current Ib and an output impedance. A difference between a positive-side power supply voltage Hvdd and a negative-side power supply voltage Vss may be higher than a withstand voltage of a transistor used in a circuitry.

FIG. 1 is a circuitry diagram illustrating an example of a level shift circuitry according to a first embodiment.

A level shift circuitry 1 includes a first impedance R1, a second impedance R2, a first transistor MN11, a second transistor MN21, a current source IB, and a first capacitor C1. The level shift circuitry 1 is supplied with the positive-side power supply voltage Hvdd from a positive-side power supply, and boosts and outputs an input signal Vin input from a terminal IN. The level shift circuitry 1 outputs an output signal Vout whose high level becomes the positive-side power supply voltage Hvdd from a terminal OUT. A load capacitance CL may be appropriately connected to the level shift circuitry 1 outside the output terminal according to an application. The illustration of the load capacitance CL is omitted in the following drawings.

The first impedance R1 has a first end connected to the positive-side power supply voltage Hvdd and a second end connected to a node N1. The second impedance R2 has a first end connected to the positive-side power supply voltage Hvdd and a second end connected to a node N2.

The first impedance R1 and the second impedance R2 operate as, for example, output impedances.

The first transistor MN11 is, for example, an n-type MOSFET. The first transistor MN11 has a drain (first end) connected to the node N1, a source (second end) connected to a node N3, and has a gate (control terminal) to which the input signal Vin is input.

The second transistor MN21 is, for example, an n-type MOSFET. The second transistor MN21 has a drain (first end) connected to the node N2, a source (second end) connected to the node N3, and a gate (control terminal) to which an inverted signal Vinb (differential signal of the input signal Vin) of the input signal is input from a terminal INB.

The first transistor MN11 and the second transistor MN21 form a differential input circuitry. The first transistor MN11 and the second transistor MN21 may be transistors having the same characteristics.

The current source IB has a first end connected to the node N3 and a second end connected to the negative-side power supply voltage Vss. The current source IB is a circuitry that causes a current to flow from the node N3 to the negative-side power supply voltage Vss. The current source IB may be a constant current source. As a non-limiting example, the negative-side power supply voltage Vss may be a ground potential.

A DC component of the output signal is defined by the current source IB, the first impedance R1, and the second impedance R2. The power supply voltage Hvdd may be a voltage higher than a withstand voltage of a transistor used in the level shift circuitry 1.

The first capacitor C1 has a first end connected to the node N2, and a second end to which a signal having the same phase as the input signal Vin is applied from a terminal CIN. That is, a signal having the same phase as the signal applied to the gate of the first transistor MN11 or a signal having a different amplitude although having the same phase as the signal applied to the first transistor MN11 may be applied to the second end of the first capacitor C1.

When the input signal is applied to the gate, the first transistor MN11 and the second transistor MN21 cause a drain current based on the input signal to flow. The second impedance R2 outputs the output signal Vout, obtained by boosting the high level of the input signal to a level of the positive-side power supply voltage Hvdd, from the terminal OUT connected to the node N2 (the second end of the second impedance R2) based on the drain current of the second transistor MN21 and a voltage between the drain and source of the second transistor MN21. As a result, the high level of the output signal Vout becomes the positive-side power supply voltage Hvdd.

When a signal having the same phase as the input signal is input to the first capacitor C1, the charge retained in a parasitic capacitance in the impedance connected to the node N2 can be injected or extracted at a high speed, that is, boosted without increasing a bias current.

As described above, it is possible to form the level shift circuitry that achieves the high-speed operation without increasing power consumption according to the present embodiment. Regarding a withstand voltage, it is sufficient for a shift level to be equal to or less than a potential difference between the drain and the source of the first transistor MN11 and the second transistor MN21.

Note that a capacitance value (boost capacitance) of the first capacitor C1 can be determined by a load capacitance, an output slew rate, a steady-state current, an input/output amplitude ratio, and the like. The capacitance value of the first capacitor C1 is desirably increased, for example, as the load capacitance increases, as the output slew rate increases, as the steady-state current decreases, or as the input/output amplitude ratio increases.

Second Embodiment

Although a relationship between an input transistor and an impedance has been described in the first embodiment described above, more specific implementation of the level shift circuitry 1 described in the first embodiment will be described in the following embodiment.

Figure 2:
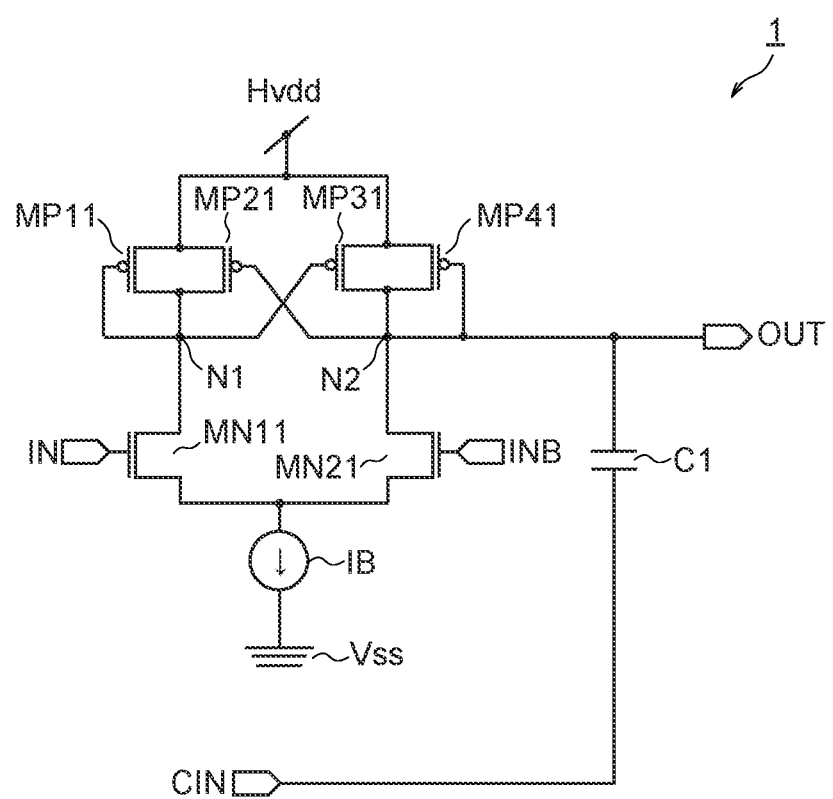

FIG. 2 is a circuitry diagram illustrating an example of a level shift circuitry according to a second embodiment. The level shift circuitry 1 includes a plurality of transistors as impedances.

Hereinafter, the same constituent portions as those of the first embodiment will be denoted by the same reference signs, the description thereof will be omitted, and only different portions will be described.

The level shift circuitry 1 includes the first transistor MN11, the second transistor MN21, the current source IB, and the first capacitor C1, and includes, as output impedances, a third transistor MP11, a fourth transistor MP21, a fifth transistor MP31, and a sixth transistor MP41.

The third transistor MP11 is, for example, a p-type MOSFET. The third transistor MP11 has a source (first end) connected to the positive-side power supply voltage Hvdd, and a gate (control terminal) and a drain (second end) which are connected to the node N1.

The fourth transistor MP21 is, for example, a p-type MOSFET. The fourth transistor MP21 has a source (first end) connected to the positive-side power supply voltage Hvdd, a gate (gate) connected to the node N2, and a drain (second end) connected to the node N1.

The fifth transistor MP31 is, for example, a p-type MOSFET. The fifth transistor MP31 has a source (first end) connected to the positive-side power supply voltage Hvdd, a gate (control terminal) connected to the node N1, and a drain (second end) connected to the node N2.

The sixth transistor MP41 is, for example, a p-type MOSFET. The sixth transistor MP41 has a source (first end) connected to the positive-side power supply voltage Hvdd, and a gate (control terminal) and a drain (second end) which are connected to the node N2. A DC potential of the output signal Vout is determined by an impedance of the diode-connected sixth transistor MP41.

That is, the third transistor MP11 and the sixth transistor MP41 are diode-connected. In addition, the gate and the drain of each of the fourth transistor MP21 and the fifth transistor MP31 are connected in a cross-coupled manner.

These transistors may be transistors having the same characteristics in terms of a threshold voltage and the like.

That is, the third transistor MP11 and the fifth transistor MP31 share the gate and the source, and thus, are turned on at the same timing. Similarly, the fourth transistor MP21 and the sixth transistor MP41 share the gate and the source, and thus, are turned on at the same timing.

At a timing when the input signal transits from low to high, the first transistor MN11 is turned on so that a potential of the node N1 becomes low, and the second transistor MN21 is turned off so that a potential of the node N2 becomes high. As a result, the third transistor MP11 and the fifth transistor MP31 are turned on, and the fourth transistor MP21 and the sixth transistor MP41 are turned off.

At this timing, a signal having the same phase as the input signal Vin is applied from the terminal CIN to the first capacitor C1, a current due to the transition of the input signal Vin flows from the first capacitor C1 to an output node (the node N2). As a result, the time for which the node N2 transits from low to high can be shortened, and electrons can be released at high speed by parasitic capacitances of the fourth transistor MP21 and the sixth transistor MP41.

At a timing when the input signal transits from high to low, the first transistor MN11 is turned off so that the potential of the node N1 becomes high, and the second transistor MN21 is turned on so that the potential of the node N2 becomes low. As a result, the third transistor MP11 and the fifth transistor MP31 are turned off, and the fourth transistor MP21 and the sixth transistor MP41 are turned on.

At this timing, a current due to the transition of the input signal Vin flows from the node N2 to the first capacitor C1. As a result, the time for which the node N2 transits from high to low can be shortened, and the charge can be released at high speed by the parasitic capacitances of the fourth transistor MP21 and the sixth transistor MP41.

In a steady state in which the input signal is kept low or high, the first capacitor C1 performs the boost operation as described above, and thus, the current output from the current source IB can be reduced, and power consumption can be suppressed.

As described above, it is possible to reduce the power consumption and achieve the high-speed operation according to the present embodiment.

Figure 3:
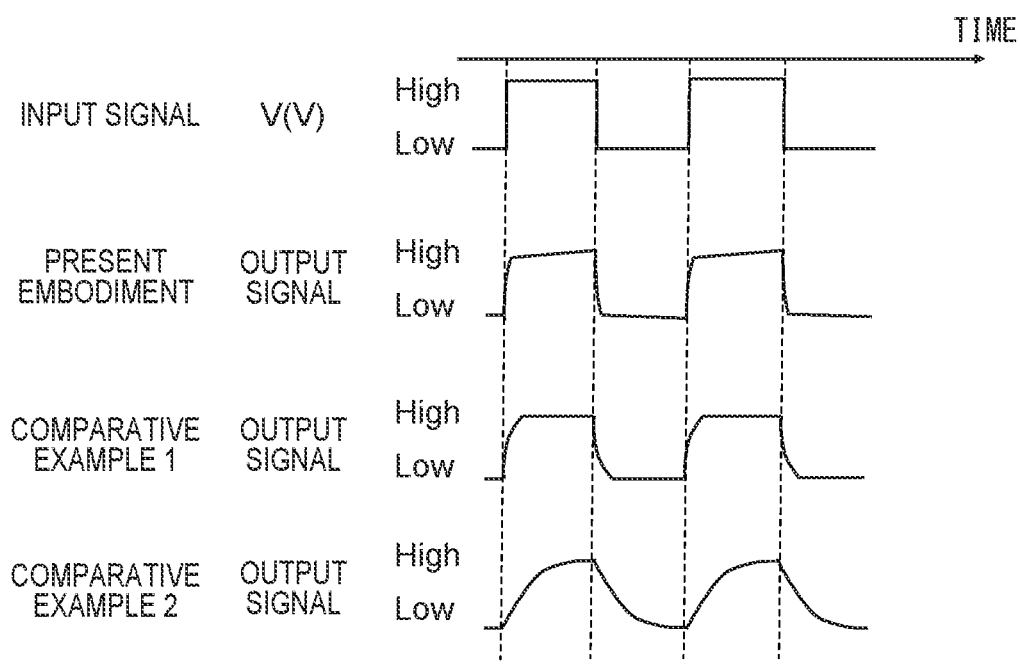
FIG. 3 is a timing chart illustrating an example of an input/output signal of a level shift circuitry according to an embodiment.

FIG. 3 is a timing chart illustrating an example of input/output waveforms according to the present embodiment. The horizontal axis represents time, and the vertical axis represents a signal value (for example, a voltage value). An input signal, an output signal according to the present embodiment, and output signals according to Comparative Example 1 and Comparative Example 2 are illustrated in order from the top. Note that high/low of the output signal is a potential higher than high/low of the input signal.

The input signal is, for example, a rectangular wave (for example, a clock signal) illustrated in the drawing.

According to the level shift circuitry 1 of the present embodiment, the output signal sufficiently follows the rise and fall of the input signal, and a bias current in the current source IB can be made extremely small (for example, 1 uA).

Comparative Example 1 is an example in which the first capacitor C1 is not provided and rise and fall times are set close to those of the present embodiment. In this example, a current to be constantly extracted from an output impedance requires a steady-state current of ten times or more of that of the level shift circuitry 1 according to the present embodiment, and power consumption considerably increases.

Comparative Example 2 is an example in which the first capacitor C1 is not provided and a bias current similar to that in the present embodiment flows. As illustrated in the drawing, it is difficult for the rise and fall of the output signal to sufficiently follow those of the input signal.

In this manner, since the first capacitor C1 is provided according to the level shift circuitry 1 according to the present embodiment, it is possible to output the level-shifted output signal that can sufficiently follow the input signal by causing the bias current of a small steady-state current to flow.

Third Embodiment

Next, an example of implementation on an input transistor side will be described. It is sufficient for a configuration of an impedance to be equivalent to that of the second embodiment described above and each of embodiments to be described later.

Figure 4:
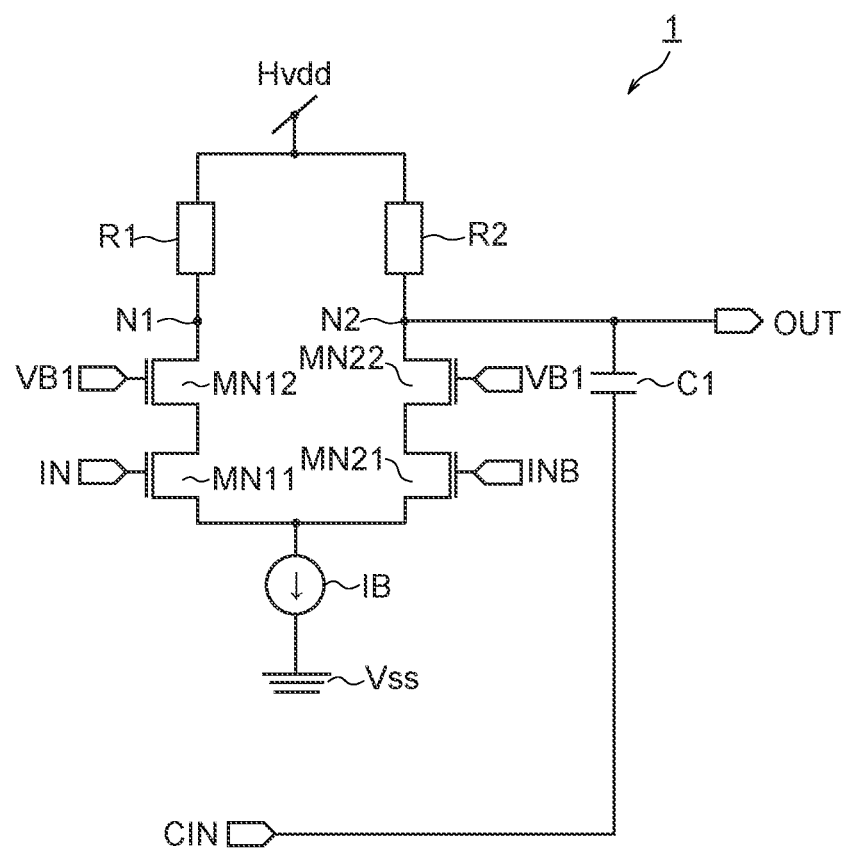
FIGS. 4 to 14 are circuitry diagrams illustrating examples of level shift circuitries according to embodiments.

FIG. 4 is a diagram illustrating a level shift circuitry according to an embodiment.

The level shift circuitry 1 may include transistors (so-called vertically stacked transistors) between a first end of the first transistor MN11 and the node N1 and between a first end of the second transistor MN21 and the node N2. The level shift circuitry 1 includes, for example, a first vertically stacked transistor MN12 and a second vertically stacked transistor MN22.

The first vertically stacked transistor MN12 has a first end connected to the node N1 and a second end connected to the first end of the first transistor MN11. A first bias voltage Vb1 is applied to a control terminal of the first vertically stacked transistor MN12.

The second vertically stacked transistor MN22 has a first end connected to the node N2 and a second end connected to the first end of the second transistor MN21. The first bias voltage Vb1 is applied to a control terminal of the second vertically stacked transistor MN22.

With such a connection, a voltage drop is generated in the first vertically stacked transistor MN12 and the second vertically stacked transistor MN12 by appropriately controlling the first bias voltage Vb1, and it is possible to shift a level to a higher level than withstand voltage performance of the first transistor MN1 and the second transistor MN2 and withstand voltage performance of the transistors included in the first impedance R1 and the second impedance R2.

Fourth Embodiment

Although the input-side transistor includes the vertically stacked transistor in the third embodiment, the number of vertically stacked transistors can be increased in order to secure higher withstand voltage performance.

Figure 5:
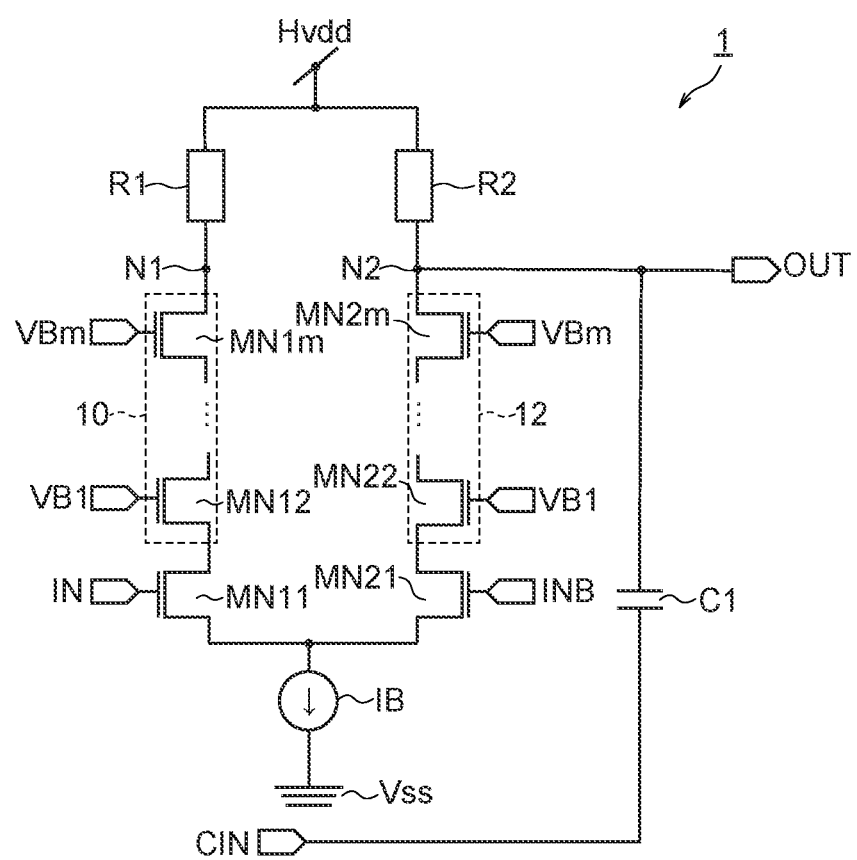

FIG. 5 is a diagram illustrating a level shift circuitry according to an embodiment. The level shift circuitry 1 includes a first transistor group 10 and a second transistor group 12.

The first transistor group 10 has a first end connected to the node N1 and a second end connected to a first end of the first transistor MN11. The first transistor group 10 includes, for example, m (m is an integer of one or more) n-type MOSFETs connected in series. Here, the series connection of transistors in the present disclosure means that a source of an upper transistor is connected to a drain of a lower transistor in two adjacent transistors.

That is, the series connection of transistors in the present disclosure refers to a state in which a source of a transistor of a lower stage (negative-side power supply voltage side) and a drain of a transistor of an upper stage (positive-side power supply voltage side) in two adjacent transistors are connected.

The first transistor group 10 includes, for example, vertically stacked transistors MN12, ..., and MN1$m$ connected in series. A second end of the vertically stacked transistor MN12 of the first stage (lowermost stage) is connected to the first end of the first transistor MN11. A first end of the vertically stacked transistor MN1$m$ of the m-th stage (uppermost stage) is connected to the node N1.

The second transistor group 12 has a first end connected to the node N2 and a second end connected to a first end of the second transistor MN21. The second transistor group 12 includes, for example, m n-type MOSFETs connected in series. A second end of the vertically stacked transistor MN22 of the first stage is connected to the first end of the second transistor MN21, and a first end of the vertically stacked transistor MN2$m$ of the m-th stage is connected to the node N2.

The transistors of the same stage in the first transistor group 10 and the second transistor group 12 may be transistors having the same performance, and respectively have control terminals to which the same bias voltage is applied.

The level shift circuitry having a high withstand voltage using a low-withstand-voltage element can be formed by controlling the bias voltage according to the present embodiment, as well Although a circuitry area increases as compared with that of the above-described embodiment, it is possible to form the level shift circuitry having a higher withstand voltage.

Fifth Embodiment

Although the level shift circuitry that achieves both the reduction in power consumption and the high-speed operation has been described in the second embodiment described above, a level shift circuitry according to the present embodiment further uses a low-withstand-voltage element and achieves a level shift within a limit of the low-withstand-voltage element. Although the withstand voltage on the input side is improved in the third embodiment and the fourth embodiment, withstand voltage performance on an impedance side can also be improved.

Figure 6:
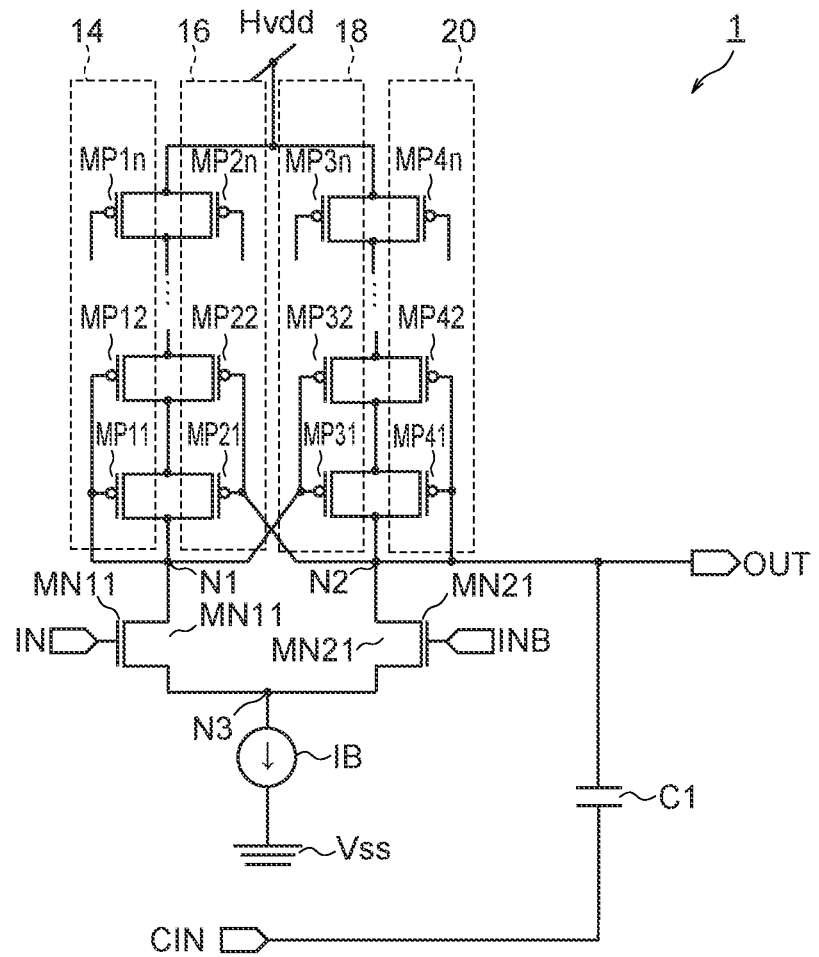

FIG. 6 is a diagram illustrating an example of a level shift circuitry including n-stage (n is an integer of one or more) transistors as output impedances.

The level shift circuitry 1 includes a third transistor group 14, a fourth transistor group 16, a fifth transistor group 18, a sixth transistor group 20, the first transistor MN11, the second transistor MN21, the current source IB, and the first capacitor C1.

The third transistor group 14 includes transistors MP11, MP12, ..., and MP1$n$. Stage configurations of the output impedances are described as a first stage, a second stage, ..., and an n-th stage in order from a negative-side power supply voltage side.

Each of the transistors included in the third transistor group 14 is, for example, a p-type MOSFET. The transistors are connected in series. Here, the series connection refers to, as an example, a connection in which a first end of the transistor MP11 is connected to a second end of the transistor MP12 similarly to the above description. In a case where a transistor MP13 is further provided, a first end of the transistor MP12 is connected to a second end of the transistor MP13.

A second end of the lowermost transistor MP11 is connected to the node N1. A first end of the uppermost transistor MP1$n$ is connected to a positive-side power supply voltage.

The respective transistors included in the third transistor group 14 share a control terminal and are connected to the node N1.

That is, the third transistor group 14 includes the plurality of transistors connected in series between the positive-side power supply voltage Hvdd and the node N1 and sharing the control terminal. In addition, a single-stage configuration illustrated in FIG. 2 can also be included as an example of the configuration illustrated in FIG. 4, instead of the plurality of series-connected transistors. As another non-limiting example, the third transistor group 14 may include the two-stage transistors MP11 and MP12.

The fourth transistor group 16 includes transistors MP21, MP22, ..., and MN2$n$.

Each of the transistors included in the fourth transistor group 16 is, for example, a p-type MOSFET. The respective transistors are connected in series similarly to the third transistor group 14.

A second end of the lowermost transistor MP21 is connected to the node N1. A first end of the uppermost transistor MP2$n$ is connected to the positive-side power supply voltage Hvdd.

In addition, the respective transistors included in the fourth transistor group 16 share a gate and are connected to the node N2.

That is, the fourth transistor group 16 includes the plurality of transistors connected in series between the positive-side power supply voltage Hvdd and the node N1 and sharing the gate similarly to the third transistor group 14. In addition, a single-stage configuration illustrated in FIG. 2 can also be included as an example of the configuration illustrated in FIG. 4, instead of the plurality of series-connected transistors. In addition, the configuration including the two-stage transistors MP21 and MP22 may be adopted.

In the third transistor group 14 and the fourth transistor group 16, the first end and the second end of the transistor MP11 and the transistor MP21 of the first stage are shared, and similarly, the first end and the second end of the transistor MP12 and the transistor MP22 of the second stage, ..., and the first end and the second end of the transistor MP1$n$ and the transistor MP2$n$ of the n-th stage are shared. In other words, the transistors included in the third transistor group 14 and the fourth transistor group 16 share the first end and the second end with the transistors belonging to the mutual groups of the same stage.

The fifth transistor group 18 includes transistors MP31, MP32, ..., and MP3$n$ connected in series.

Each of the transistors included in the fifth transistor group 18 has the same configuration as that of the fourth transistor group 16.

The sixth transistor group 20 includes transistors MP41, MP42, ..., and MP4$n$ connected in series.

Each of the transistors included in the sixth transistor group 20 has the same configuration as that of the third transistor group 14.

In the transistors included in the fifth transistor group 18 and the sixth transistor group 20 as well, the mutual transistors provided on the same stage share a drain (the second end) and share a source (the first end) similarly to the transistors included in the third transistor group 14 and the fourth transistor group 16.

With such a configuration, even if the individual transistor has a low withstand voltage, a withstand voltage on an output impedance side can be set to a high withstand voltage.

Sixth Embodiment

Figure 7:
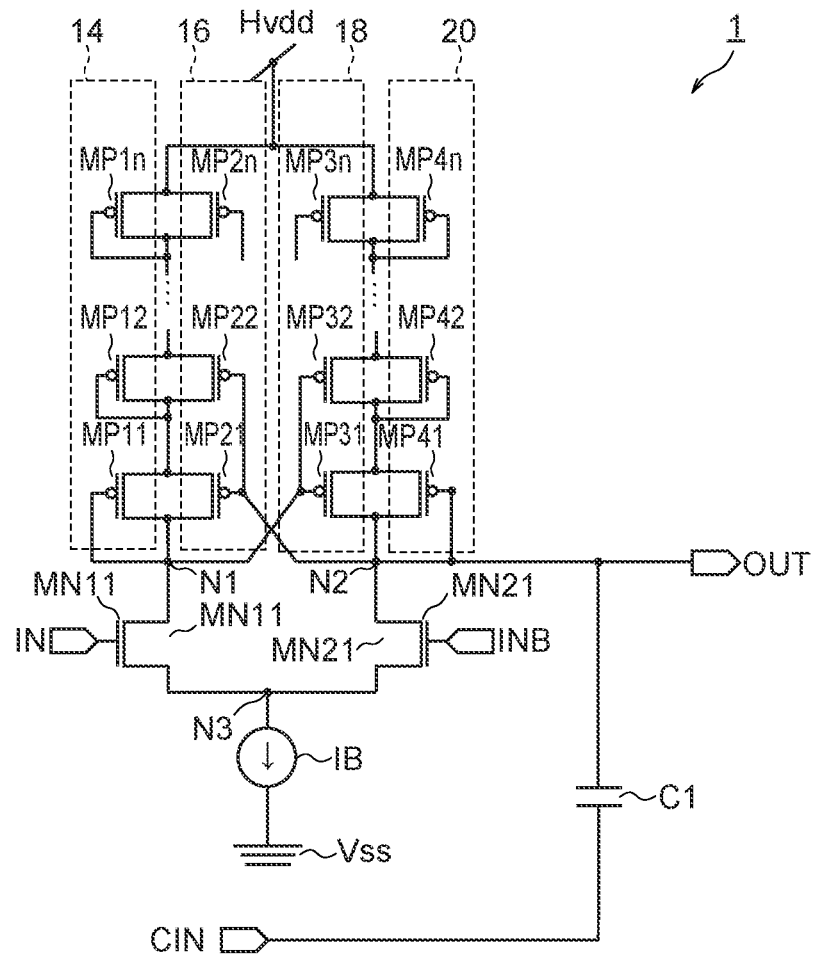

FIG. 7 is an example of a level shift circuitry according to an embodiment.

The level shift circuitry 1 includes the third transistor group 14, the fourth transistor group 16, the fifth transistor group 18, and the sixth transistor group 20.

The third transistor group 14 includes transistors MP11, MP12, ..., and MP1$n$.

Each of the transistors included in the third transistor group 14 is, for example, a p-type MOSFET. The respective transistors are connected in series.

A second end of the lowermost transistor MP11 is connected to the node N1. A first end of the uppermost transistor MP1$n$ is connected to a positive-side power supply voltage.

In addition, the respective transistors included in the third transistor group 14 adopt a diode connection whose control terminal (gate) is connected to the respective second ends (drains).

That is, the third transistor group 14 includes the transistors connected in series between the positive-side power supply voltage Hvdd and the node N1 and having the control terminal connected to the respective second ends. In addition, the single-stage configuration illustrated in FIG. 2 can also be included as an example of the configuration illustrated in FIG. 7, instead of the plurality of series-connected transistors. In addition, the configuration including the two-stage transistors MP11 and MP12 may be adopted.

The fourth transistor group 16 includes transistors MP21, MP22, ..., and MP2$n$.

Each of the transistors included in the fourth transistor group 16 is, for example, a p-type MOSFET. The transistors are connected in series.

In addition, the respective transistors included in the fourth transistor group 16 share a control terminal and are connected to the node N2.

That is, the fourth transistor group 16 includes the plurality of transistors connected in series between the positive-side power supply voltage Hvdd and the node N1 and sharing the control terminal similarly to the third transistor group 14. In addition, the single-stage configuration illustrated in FIG. 2 can also be included as an example of the configuration illustrated in FIG. 7, instead of the plurality of series-connected transistors. In addition, the configuration including the two-stage transistors MP21 and MP22 may be adopted.

Further, the transistor MP11 and the transistor MP21 share the first end and the second end, and the transistors of the same stage such as the transistor MP12 and the transistor MP22, ..., or the transistor MP1*n* and the transistor MP2*n* share the first end (source) and the second end (drain).

The fifth transistor group 18 includes transistors MP31, MP32, ..., and MP3*n*.

Each of the transistors included in the fifth transistor group 18 has the same configuration as that of the fourth transistor group 16.

The sixth transistor group 20 includes transistors MP41, MP42, ..., and MP4*n*.

Each of the transistors included in the sixth transistor group 20 has the same configuration as that of the third transistor group 14.

The transistors of the same stage in the fifth transistor group 18 and the sixth transistor group 20 also share the first end and the second end similarly to the transistors of the same stage in the third transistor group 14 and the fourth transistor group 16.

Since the output impedance is formed using the vertically stacked transistor in the above-described embodiments, a threshold voltage of the entire impedance can be increased (a gate length can be increased). As a result, an amplitude of a voltage on an output side can be appropriately controlled. On the other hand, the threshold voltage depends on each of the transistors, but the impedance can be appropriately set according to a configuration of a vertically stacked transistor in the present embodiment. As a result, a DC component of an output voltage can be stabilized.

Seventh Embodiment

Although examples of the implementation of the transistor related to the input and the output has been described in each of the above-described embodiments, some examples of implementation of the current source IB will be described in the present and subsequent embodiments.

Figure 8:
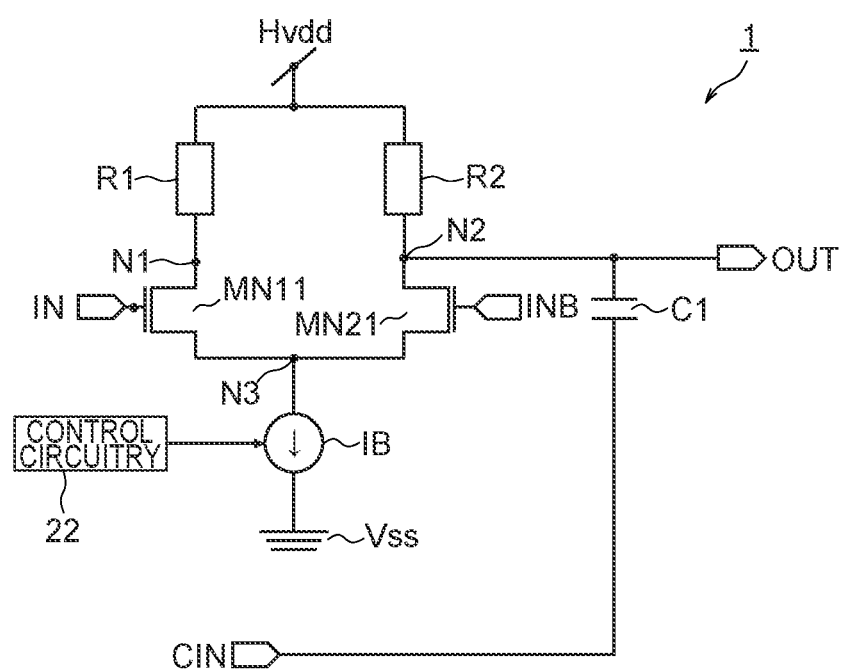

FIG. 8 is a diagram illustrating an example of a level shift circuitry according to an embodiment. The current source IB of the level shift circuitry 1 can control a current output by a control circuitry 22. For example, the control circuitry 22 may control a bias current output from the current source IB at rising and falling timings of the input signal Vin or the output signal Vout, that is, signal transition timings.

For example, the control circuitry 22 may perform control such that a current flowing through the current source IB decreases at the rising timing of the output signal Vout, and perform control such that a potential of the node N2 increases at a higher speed. Similarly, for example, the control circuitry 22 may perform control such that a current flowing through the current source IB increases at the falling timing of the output signal Vout, and perform control such that a potential of the node N2 decreases at a higher speed.

In addition, as another example, in a case where overshoot occurs due to a certain factor in a transition of a signal, the control circuitry 22 may perform reverse control of the above description, that is, increase the current flowing at the rising timing of the output signal Vout and decrease the current flowing at the falling timing so as to suppress the overshoot.

Figure 9:
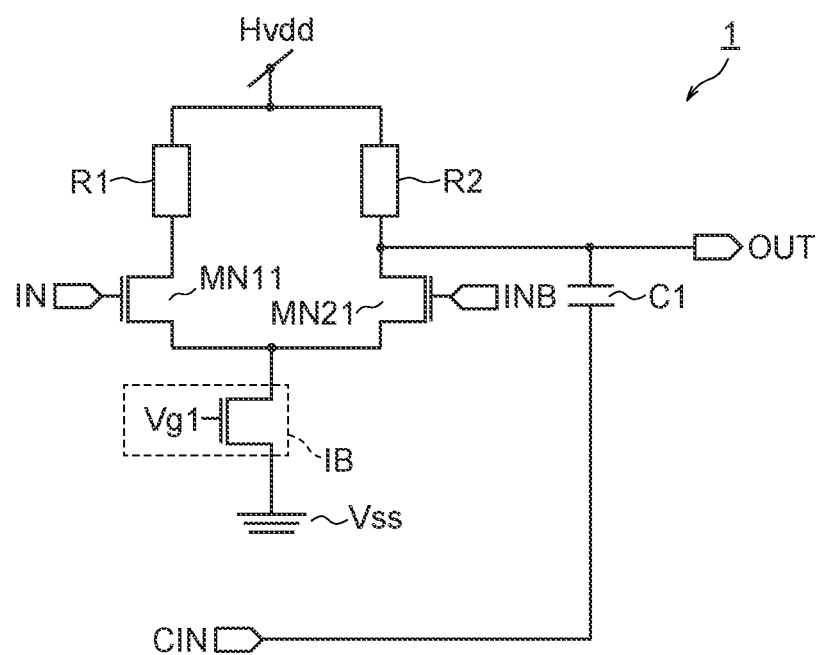

FIG. 9 is a diagram illustrating a mode of the current source IB in the present embodiment. The current source IB may be, for example, an n-type MOSFET (current source transistor). The current source transistor has a first end connected to second ends of the first transistor MN11 and the second transistor MN21, a second end connected to the negative-side power supply voltage Vss, and a control terminal connected to the control circuitry 22. The control circuitry 22 may control the current source IB by controlling a voltage Vg applied to a gate of the n-type MOSFET.

Figure 10:
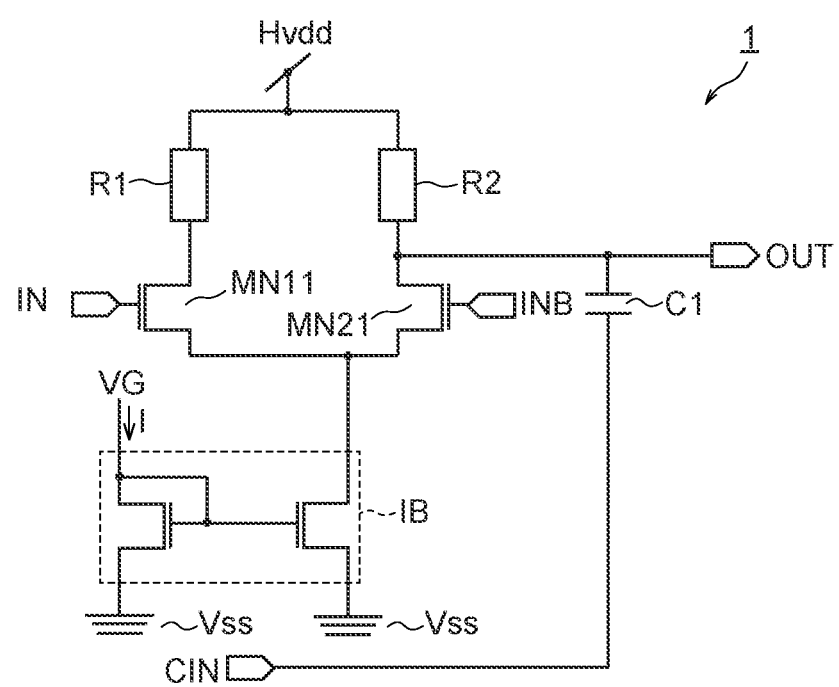

FIG. 10 is a diagram illustrating a mode of the current source IB in the present embodiment. The current source IB may include a current mirror.

The current source IB can control the magnitude of a current to be taken from the first transistor MN11 and the second transistor MN21 by controlling a current on an input side of the current mirror.

Figure 11:
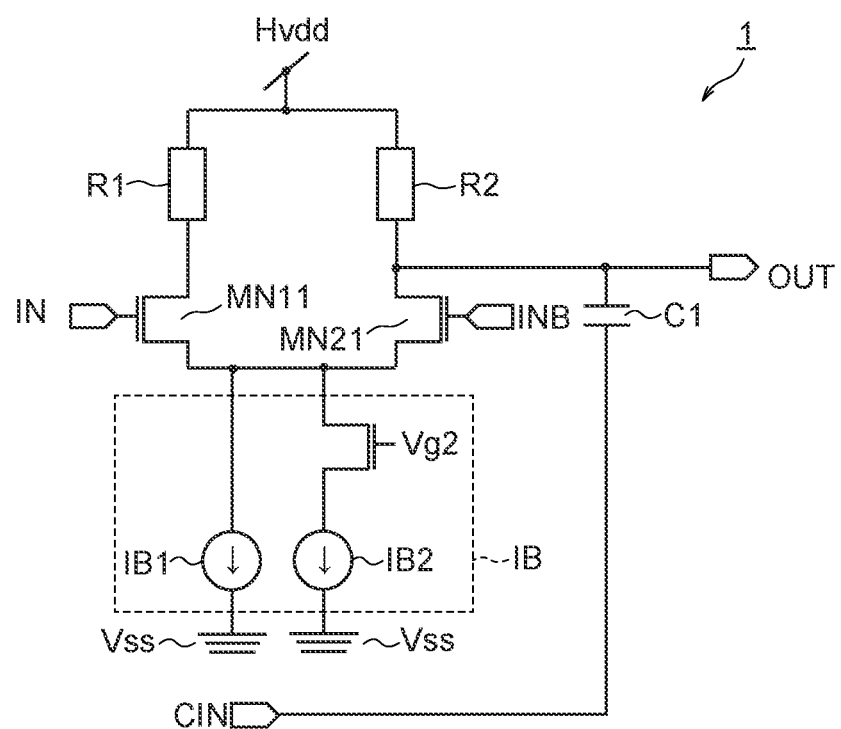

FIG. 11 is a diagram illustrating a mode of the current source IB in the present embodiment. The current source IB may include a first current source IB1 and a second current source IB2. The first current source IB1 continues to cause a predetermined bias current Ib1 to flow, for example.

The second current source IB2 continues to cause a predetermined bias current Ib2 to flow. The second current source IB2 may use a control unit to control the current to be taken from the first transistor MN11 and the second transistor MN21.

As an example of the control unit, a current source transistor, which is an n-type MOSFET, may be connected between the first transistor MN11 and the second transistor MN21, and the second current source IB2. The current taken by the second current source IB2 is controlled by a voltage Vg2 applied to a gate of the current source transistor.

The voltage Vg2 is controlled to, for example, a voltage at which a drain current of the current source transistor is not saturated in a steady state. From this state, the voltage Vg2 is controlled to be high when the flowing current is increased, and the voltage Vg2 is controlled to be low when the flowing current is decreased.

In this manner, a predetermined current can be taken by the first current source IB1, and appropriate current control can be performed using the second current source IB2 at a signal transition timing.

Figure 12:
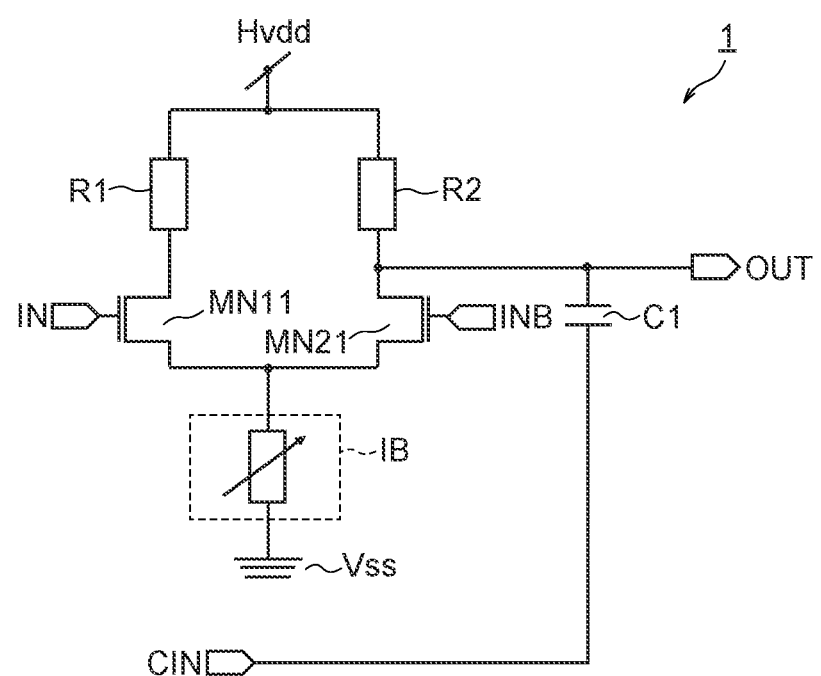

FIG. 12 is a diagram illustrating a mode of the current source IB in the present embodiment. The current source IB may include a variable resistor. The variable resistor has a first end connected to the second ends of the first transistor MN11 and the second transistor MN21, and a second end connected to the negative-side power supply voltage Vss. When a resistance value of the variable resistor is controlled, a current value output from the current source IB can be controlled.

As described above, it is possible to achieve a further boost effect by controlling the current in the current source in the level shift circuitry according to the present embodiment.

Eighth Embodiment

Figure 13:
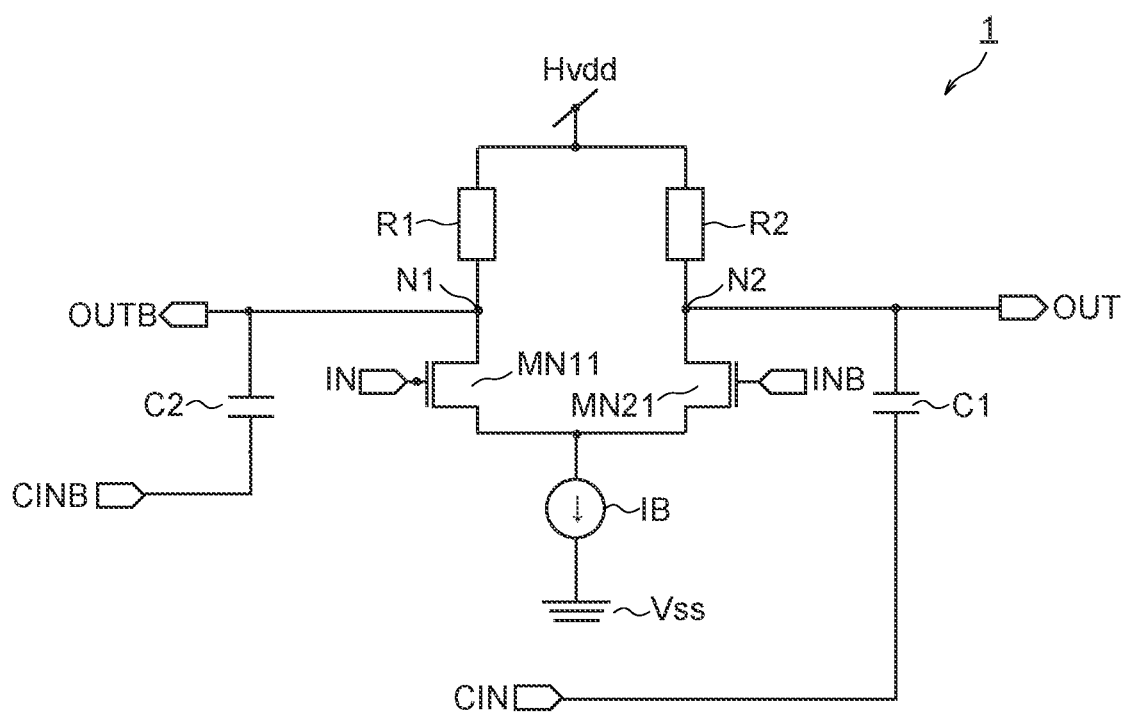

FIG. 13 is a diagram illustrating an example of a level shift circuitry according to an embodiment. As illustrated in this drawing, the level shift circuitry 1 may include a terminal OUTB that further outputs a differential signal Voutb of the output voltage Vout. The terminal OUTB is connected to the node N1. Further, the level shift circuitry 1 includes a second capacitor C2 configured to boost the differential signal Voutb.

The second capacitor C2 has a first end connected to the node N1 and has a second end to which a differential signal of a signal applied to a second end of the first capacitor C1 is applied. The operation of the second capacitor C2 is similar to that of the first capacitor C1.

In this manner, in a case where the level shift circuitry 1 outputs the differential signal, it is possible to appropriately boost a signal to be output similarly to each of the above-described embodiments by providing the capacitor even at the terminal that outputs an inverted signal.

Ninth Embodiment

Figure 14:
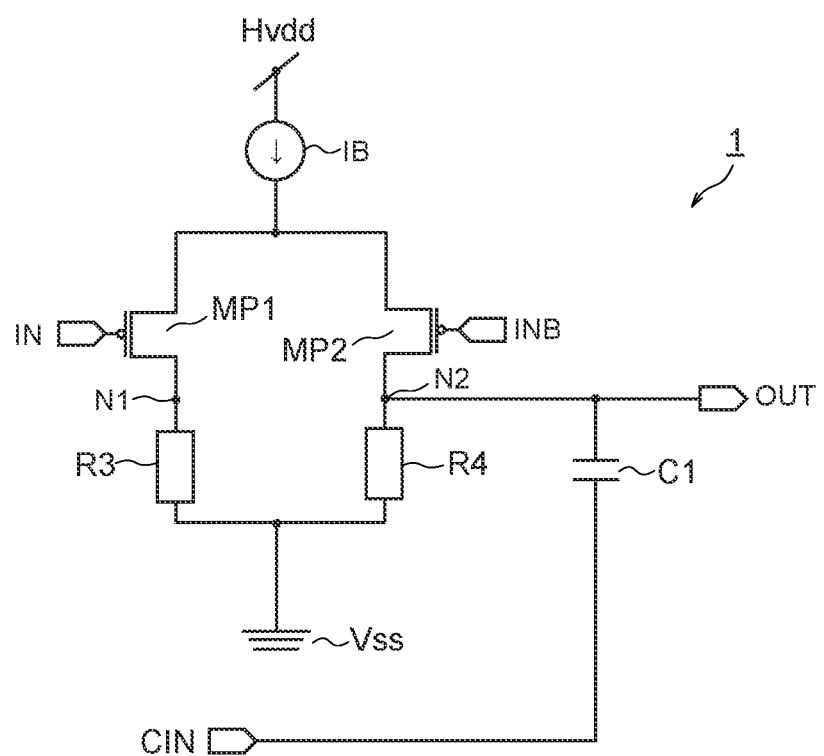

FIG. 14 is a diagram illustrating an example of a level shift circuitry according to an embodiment. The level shift circuitry 1 includes transistors N1 and N2 that receive differential input signals, the current source IB, and impedances R3 and R4 on an output side.

The impedances R3 and R4 include, for example, a plurality of n-type MOSFETs in the same mode as the p-type MOSFETs in each of the above-described embodiments.

As illustrated in this drawing, an aspect in which the n-type MOSFET and the p-type MOSFET are appropriately replaced with each other may be adopted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A level shift circuitry comprising:
a first impedance having a first end connected to a positive-side power supply voltage;
a second impedance having a first end connected to the positive-side power supply voltage and outputting an output signal from a second end;
a first transistor having a control terminal to which an input signal is input and a first end connected to a second end of the first impedance;
a second transistor having a control terminal to which a differential signal of the input signal is input, a first end connected to the second end of the second impedance, and a second end connected to a second end of the first transistor;
a current source having a first end connected to the second end of the first transistor and a second end connected to a negative-side power supply voltage; and
a first capacitor having a first end connected to the second end of the second impedance and a second end to which a signal having a same phase as the input signal is input.

2. The level shift circuitry according to claim 1, further comprising:
a first transistor group which include transistors of m (m≥1) stages connected in series and having control terminals that are applied with a bias voltage, and in which a second end of a transistor of a first stage is connected to the first end of the first transistor, and a first end of a transistor of an m-th stage is connected to the second end of the first impedance; and
a second transistor group which include transistors of m stages connected in series and each having a control terminal that is applied with a same bias voltage as a transistor of a same stage in the first transistor group, and in which a second end of a transistor of a first stage is connected to the first end of the second transistor, and a first end of a transistor of an m-th stage is connected to the second end of the second impedance.

3. The level shift circuitry according to claim 2, wherein
the first transistor group includes a first vertically stacked transistor having a control terminal to which a first bias voltage is applied, a first end connected to the second end of the first impedance, and a second end connected to the first end of the first transistor, and
the second transistor group includes a second vertically stacked transistor having a control terminal to which the first bias voltage is applied, a first end connected to the second end of the second impedance, and a second end connected to the first end of the second transistor.

4. The level shift circuitry according to claim 1, wherein
the first impedance includes
a third transistor group which include transistors of n (n≥1) stages connected in series and having control terminals connected to the first end of the first transistor, and in which a second end of a transistor of a first stage is connected to the first end of the first transistor, and a first end of a transistor of an n-th stage is connected to the positive-side power supply voltage, and
a fourth transistor group which include transistors of n stages connected in series, having control terminals connected to the first end of the second transistor, each having a first end connected to a first end of a transistor of a same stage in the third transistor group, and each having a second end connected to a second end of a transistor of a same stage in the third transistor group, and
the second impedance includes
a fifth transistor group which include transistors of n stages connected in series and having control terminals connected to the first end of the first transistor, and in which a second end of a transistor of a first stage is connected to the first end of the second transistor, and a first end of a transistor of an n-th stage is connected to the positive-side power supply voltage, and
a sixth transistor group which include transistors of n stages connected in series, having control terminals connected to the first end of the second transistor, each having a first end connected to a first end of a transistor of a same stage in the fifth transistor group, and each having a second end connected to a second end of a transistor of a same stage in the fifth transistor group.

5. The level shift circuitry according to claim 4, wherein
the third transistor group includes a third transistor having a first end connected to the positive-side power supply voltage and a second end connected to the first end of the first transistor, the fourth transistor group includes a fourth transistor having a first end connected to the first end of the third transistor and a second end connected to the second end of the third transistor, the fifth transistor group includes a fifth transistor having a first end connected to the positive-side power supply voltage and a second end connected to the first end of the second transistor, and the sixth transistor group includes a sixth transistor having a first end connected to the first end of the fifth transistor and a second end connected to the second end of the fifth transistor.

6. The level shift circuitry according to claim 1, wherein the first impedance includes a third transistor group which include transistors of n ($n \geq 1$) stages connected in series and having control terminals connected to respective second ends, and in which the second end of a transistor of a first stage is connected to the first end of the first transistor, and a first end of a transistor of an n-th stage is connected to the positive-side power supply voltage, and a fourth transistor group which include transistors of n stages connected in series, having control terminals connected to the first end of the second transistor, each having a first end connected to a first end of a transistor of a same stage in the third transistor group, and each having a second end connected to a second end of a transistor of a same stage in the third transistor group, and the second impedance includes a fifth transistor group which include transistors of n stages connected in series and having control terminals connected to the first end of the first transistor, and in which a second end of a transistor of a first stage is connected to the first end of the second transistor, and a first end of a transistor of an n-th stage is connected to the positive-side power supply voltage, and a sixth transistor group which include transistors of n stages connected in series, having control terminals connected to respective second ends, each having a first end connected to a first end of a transistor of a same stage in the fifth transistor group, and each having the second end connected to a second end of a transistor of a same stage in the fifth transistor group.

7. The level shift circuitry according to claim 1, further comprising:

a first transistor group which include transistors of m ($m \geq 1$) stages connected in series and having control terminals that are applied with a bias voltage, and in which a second end of a transistor of a first stage is connected to the first end of the first transistor, and a first end of a transistor of an m-th stage is connected to the second end of the first impedance; and a second transistor group which include transistors of m stages connected in series and each having a control terminal that is applied with a same bias voltage as a transistor of a same stage in the first transistor group, and in which a second end of a transistor of a first stage is connected to the first end of the second transistor, and a first end of a transistor of an m-th stage is connected to the second end of the second impedance, wherein the first impedance includes a third transistor group which include transistors of n ($n \geq 1$) stages connected in series and in which a second end of a transistor of a first stage is connected to the first end of the transistor of the m-th stage in the first transistor group, and a first end of a transistor of an n-th stage is connected to the positive-side power supply voltage, and a fourth transistor group which include transistors of n stages connected in series, each having a first end connected to a first end of a transistor of a same stage in the third transistor group, and each having a second end connected to a second end of a transistor of a same stage in the third transistor group, and the second impedance includes a fifth transistor group which include transistors of n stages connected in series and in which a second end of a transistor of a first stage is connected to the first end of the transistor of the m-th stage in the second transistor group, and a first end of a transistor of an n-th stage is connected to the positive-side power supply voltage, and a sixth transistor group which include transistors of n stages connected in series, each having a first end connected to a first end of a transistor of a same stage in the fifth transistor group, and each having a second end connected to a second end of a transistor of a same stage in the fifth transistor group.

8. The level shift circuitry according to claim 1, wherein the current source includes a control circuitry that varies a current when a signal transits.

9. The level shift circuitry according to claim 8, wherein the current source includes:

a first current source having a first end connected to the second end of the first transistor and a second end connected to the negative-side power supply voltage; and a second current source having a first end connected to the second end of the first transistor and a second end connected to the negative-side power supply voltage, and causing a current to flow when the input signal transits.

10. The level shift circuitry according to claim 8, wherein the current source includes a current source transistor having a control terminal to which a first bias voltage is applied, a first end connected to the second end of the first transistor, and a second end connected to the negative-side power supply voltage.

11. The level shift circuitry according to claim 8, wherein the current source includes a variable resistor having a first end connected to the second end of the first transistor and a second end connected to the negative-side power supply voltage.

12. The level shift circuitry according to claim 8, wherein the current source includes a current mirror circuitry.

13. The level shift circuitry according to claim 1, further comprising a second capacitor having a first end connected to the second end of the first impedance and a second end connected to a signal having an opposite phase to the input signal, wherein a signal having an opposite phase to the output signal is output from the second end of the first impedance.

* * * * *